United States Patent
Hashimoto

(10) Patent No.: US 6,805,541 B1
(45) Date of Patent: Oct. 19, 2004

(54) RESIN ENCAPSULATING APPARATUS USED IN A MANUFACTURE OF A SEMICONDUCTOR DEVICE

(75) Inventor: Kenji Hashimoto, Machida (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/503,170

(22) Filed: Feb. 14, 2000

(30) Foreign Application Priority Data

Feb. 15, 1999 (JP) .......................................... 11-035464

(51) Int. Cl.⁷ ................................................. H01L 21/56
(52) U.S. Cl. ...................... 425/110; 425/218; 425/447; 438/127; 264/272.17
(58) Field of Search ................................ 425/110, 117, 425/129.1, 218, 258, 447; 438/127; 204/272.17

(56) References Cited

U.S. PATENT DOCUMENTS

| | | | |
|---|---|---|---|
| 4,188,706 A | * | 2/1980 | Millard et al. ............. 29/25.03 |
| 5,145,691 A | * | 9/1992 | Kawakami et al. ......... 425/110 |
| 5,232,651 A | * | 8/1993 | Okuno et al. ........... 264/272.15 |
| 5,587,342 A | * | 12/1996 | Lin et al. |
| 5,776,799 A | * | 7/1998 | Song et al. ................. 438/111 |
| 5,863,805 A | * | 1/1999 | Chiang ....................... 438/123 |
| 5,920,770 A | | 7/1999 | Yasunaga et al. ........... 438/124 |

FOREIGN PATENT DOCUMENTS

| | | | |
|---|---|---|---|
| JP | 5-175260 | | 7/1993 |
| JP | 05175260 A | * | 7/1993 |
| JP | 10-116928 | | 5/1998 |
| JP | 11224883 A | * | 8/1999 |

* cited by examiner

*Primary Examiner*—Robert B. Davis
(74) *Attorney, Agent, or Firm*—Finnegan, Henderson, Farabow, Garrett & Dunner, L.L.P.

(57) ABSTRACT

A semiconductor device is retained on a retaining section. A mask is set on the semiconductor device and has an opening at which part of the semiconductor device is exposed. An extruding section is moved by a first drive section over an opening in the mask and, during this movement, extrudes a fluidizing resin into the opening in the mask. A squeegee is moved by a second drive section over the opening in the mask to allow a movement of the fluidizing resin present over the opening which is extruded into the opening from an extruding section and a removal of any excessive resin from the plane of the opening.

14 Claims, 13 Drawing Sheets

RESIN ENCAPSULATING APPARATUS USED IN A MANUFACTURE OF A SEMICONDUCTOR DEVICE

CROSS-REFERENCE TO RELATED APPLICATION

This application is based upon and claims the benefit of priority from the prior Japanese Patent Application No. 11-035464, filed Feb. 15, 1999, the entire contents of which are incorporated herein by reference.

BACKGROUND OF THE INVENTION

The present invention relates to a semiconductor manufacturing apparatus used in an assembling step of a semiconductor device and method for manufacturing a semiconductor device and, in particular, to a resin encapsulating apparatus for forming a resin sealing body on a semiconductor chip and resin encapsulating method using the resin encapsulating apparatus.

As a package structure of a semiconductor device there are known a ceramics package sealing a chip-like semiconductor substrate with semiconductor elements, such as a semiconductor circuit formed thereon, with the use of a ceramics container made of, for example, alumina, a resin encapsulated package with a resin sealing body formed by a transfer molding method, etc., and a TCP (tape carrier package) package, etc., formed by dropwise supplying a liquid-like resin to a chip-to-lead connection portion on a semiconductor chip (hereinafter referred to as a chip) with the use of a TAB (tape automated bonding) system. As a method for coating a resin sealing body on such a connection portion, there are the above-mentioned method for forming a package by dropwise supplying a given amount of liquid-like resin on such a portion and curing it and a method, etc., of printing a liquid-like resin of a given viscosity on a connection portion with the use of a mask.

The conventional resign encapsulating apparatus for manufacturing the semiconductor device will be explained below with reference to FIGS. 1 and 2. FIG. 1 is a perspective view showing a resin encapsulating apparatus for sealing a resin with the use of a given amount extruding method.

The resin encapsulating apparatus using such a given amount extruding method of FIG. 1 has the following structure. A resin 1, such as an epoxy, having a viscosity is contained within a cylinder 2. This cylinder 2 is mounted on the cylinder holder 3. The cylinder holder 3 is arranged on an XYZ drive section 4 movable in XYZ directions (horizontal and vertical directions). The cylinder 2 is connected to a given quantity extruding device 6 via an air tube 5. An air pressure control mechanism is provided at the given quantity extruding device 6. By the air pressure control mechanism, the liquid-like resin 1 of an amount necessary to the sealing operation is extruded from the forward end of the cylinder 2 and coated on a target member (here, a semiconductor chip mounted on a tape carrier).

At the resin encapsulating apparatus, a conveying section 8 is provided for setting a tape carrier 7 to a predetermined position and the liquid-like resin 1 is coated. For example, the tape carrier 7 is conveyed to a predetermined position. Further, the tape carrier 7 is positioned by a positioning block 9 and fixed in place. The cylinder 2 is moved by the XYZ drive section 4 to a coating position on the tape carrier 7. While moving the cylinder 2 in accordance with an initially registered pattern, a given amount of liquid-like resin 1 is coated on the tape carrier 7. By doing so, a predetermined portion of the chip is sealed.

FIG. 2 is a perspective view showing a resin encapsulating apparatus for performing resin sealing by a printing method. The resin encapsulating apparatus using a printing method as shown in FIG. 2 includes a conveying section 11, positioning fixing block 12, mask 13, squeegee 16, up/down drive section 17 and X, Y direction drive section 18. A tape carrier 10 with a chip mounted thereon is conveyed by the conveying section 11 to a predetermined position. Further, the tape carrier 10 is positioned by a positioning fixing block 12 and fixed in place. The fixed tape carrier 10 is moved by the block drive section (not shown) to a predetermined position and, after being lifted, pushed against the mask 13 set over the conveying section 11.

An opening 14 is provided in the mask to correspond to a coating position. A resin 15 of a given viscosity is placed on a predetermined position of the mask 13. The squeegee 16 placed over the mask 13 is moved by the up/down drive section 17 to a position contacting with the mask 13 and further moved by the drive section 18 (moved in the X direction in this case-or in the Y direction) in the X direction (or the Y direction) over the opening 14 of the mask 13. At this time, since a resin 15 is initially extruded on a position between the down position of the squeegee 16 and the opening 14, the resin 15 is filled in the opening 14 by the above-mentioned operation. By doing so, a predetermined portion of the chip is sealed.

These methods have the following problems. In the given quantity extruding method, since the liquid-like resin serving as a resin sealing body for the chip has a considerable high viscosity, it is not possible to control the spreading, etc., of the resin at a time of coating. As a result, there is a problem that a horizontal accuracy of the resin in the horizontal direction (X, Y directions) is lowered. This method is directed to dropwise supplying a given amount of liquid-like resin to a predetermined position to allow it to be spread in its own natural way, thus posing a problem that the thickness of the resin sealing body never becomes uniform and a defective product is produced due to variation, etc., in sealing thickness of the resin.

In the printing system, a given amount of resin (15) is deposited on the mask 13 and, through a repeated printing operation, only a given amount of resin is extruded onto the mask 13 when that amount of resin is lowered. As a result, there occurs a variation in viscosity of the resin, no complete filling of the resin in a filling site occurs, sometimes leaving no resin-filled area. This method takes more resin at a time of finishing the operation and more product costs.

FIGS. 3A to 3D are cross-sectional views showing a resin coating section of a semiconductor device in the printing method using the resin encapsulating apparatus shown in FIG. 2. As shown in FIG. 3A, the tape carrier 10 with a chip 70 mounted thereon is placed on the positioning fixing block 12. The mask 13 having the opening 14 is set on the tape carrier 10. In this state, the resin 15 of a viscous nature is extruded on the mask 13. And the resin 15 is held by the squeegee 16 and, as shown in FIGS. 3B and 3C, the squeegee 16 is moved along the plane of the opening 14. By doing so, the resin 15 is buried in the opening 14. In the case where the resin 15 was so buried by the above-mentioned method, it follows that, since the resin 15 is relatively high in viscosity, it is not fully filled at the corners of the bottom of the opening 14. This poses a problem of producing a defective semiconductor device. Such a problem becomes prominent in a semiconductor device of such a type that the protective resin sealing body and balls for external connection are provided on the same surface side.

BRIEF SUMMARY OF THE INVENTION

The present invention is achieved to solve the above-mentioned task and is directed to providing a resin encapsulating apparatus and method which can enhance dimensional accuracy of a resin sealing body formed on a semiconductor device and prominently reduce occurrence of defective products resulting from an insufficient filling of resin and use the resin very effectively.

In a first aspect of the present invention, there is provided a resin encapsulating apparatus comprising a retaining section for retaining a semiconductor device, a mask set on the semiconductor device and having an opening at which part of the semiconductor device is exposed, an extruding section for extruding a fluidizing resin into the opening of the mask, a first drive section for driving the extruding section, a squeegee for causing a movement of the fluidizing resin present over the opening which is extruded from the extruding section into the opening, and a second drive section for driving the squeegee.

In a second aspect of the present invention, a resin encapsulating apparatus for forming a protective resin sealing body on a semiconductor device in which the resin sealing body and external connection balls are formed on the same surface side of the semiconductor device, the resin encapsulating apparatus comprising a retaining section for retaining the semiconductor device, a mask set on the semiconductor device and having an opening at which, when the mask is set on the semiconductor device, an area of the semiconductor device at which the resin sealing body is to be formed is exposed, an extruding section for extruding a fluidizing resin into the opening of the mask, a first drive section for driving the extruding section, a squeegee for causing a movement of the fluidizing resin present over the opening which is extruded from the extruding section into the opening, and a second drive section for driving the squeegee.

In a third aspect of the present invention, a resin encapsulating method comprises the steps of retaining a semiconductor device, setting an opening-equipped mask on the semiconductor device and exposing part of the semiconductor device, extruding a fluidizing resin into the opening of the mask, and moving a squeegee over the opening of the mask to cause a movement of the fluidizing resin present over the opening which is extruded into the opening.

In a fourth aspect of the present invention, a resin encapsulating method for forming a protective resin sealing body in which the resin sealing body and external connection balls are formed on the same surface side of the semiconductor substrate, the method comprising the steps of retaining the semiconductor substrate, setting an opening-equipped mask on the semiconductor device and exposing, from the opening, an area of the semiconductor device at which the resin sealing body is formed, extruding a fluidizing resin into the opening of the mask, and moving a squeegee over the opening of the mask to cause a movement of the fluidizing resin present over the opening which is extruded into the opening.

According to the resin encapsulating apparatus and method thus obtained, since the fluidizing resin is extruded directly from an extruding section into the opening in the mask, the viscosity of the fluidizing resin never becomes higher and it is possible to fill the fluidizing resin into the opening without leaving any insufficiently filled area. Further, after the fluidizing resin has been extruded into the opening in the mask, the squeegee is moved over the opening along the surface of the mask to remove any excessive fluidizing resin and it is possible to provide a resin sealing body with high positional accuracy in the X, Y and Z directions. It is also possible to freely set the position and shape of the resin sealing body by the configuration of the mask and to freely set the thickness of the resin sealing body by the thickness of the mask. Further, since this eliminates the need to coat a more than necessary amount of fluidizing resin and thus to very effectively use the fluidizing resin.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A first embodiment of the present invention will be explained below with reference to FIGS. 4 and 5A to 5D.

Figure 1:
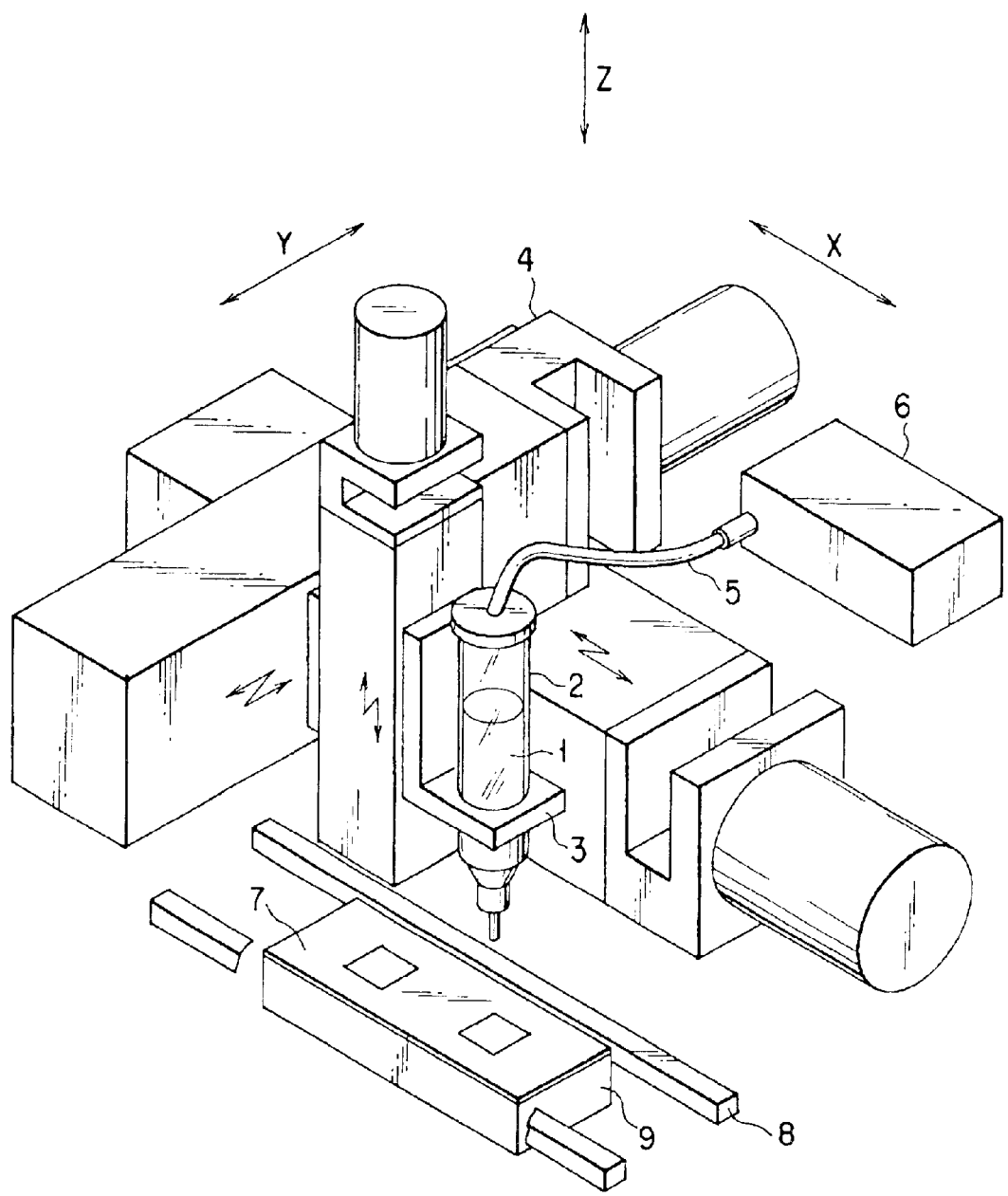
FIG. 1 is a perspective view showing a conventional resin encapsulating apparatus.
Figure 2:
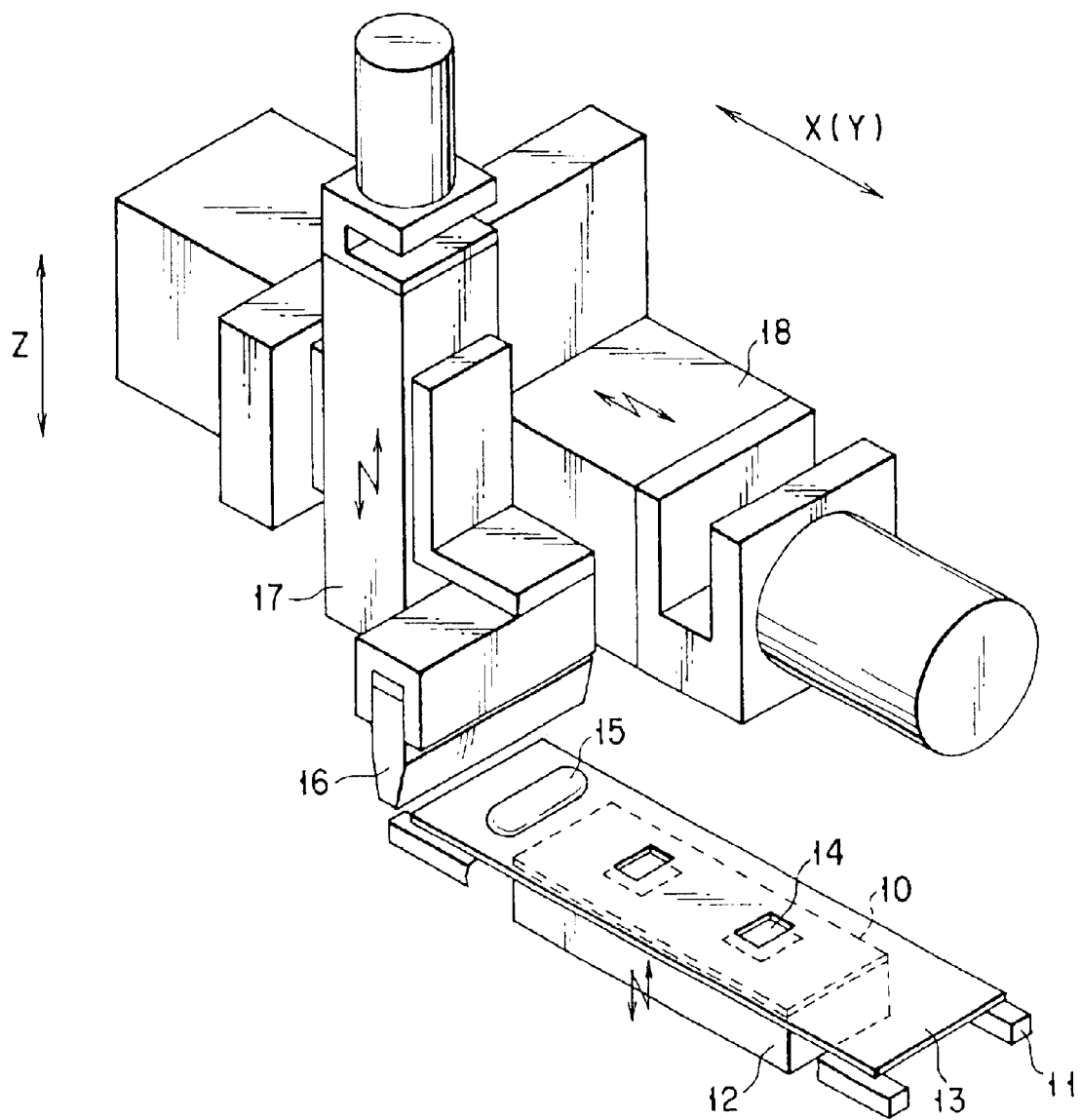
FIG. 2 is a perspective view showing another conventional resin encapsulating apparatus.
Figure 3A:
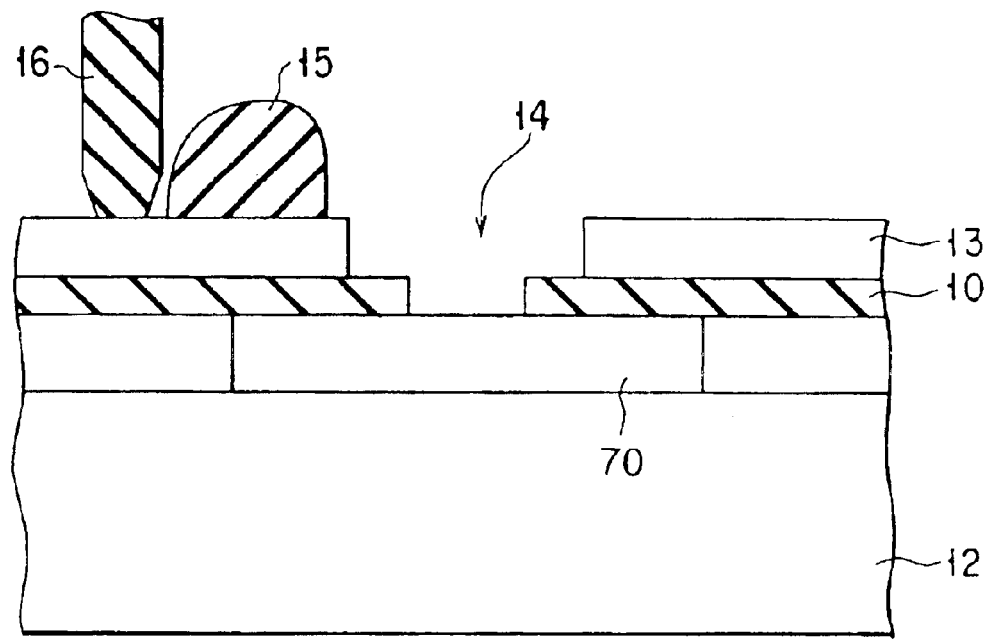
FIGS. 3A to 3D are cross-sectional views showing the steps of a conventional resin encapsulating method.
Figure 3B:
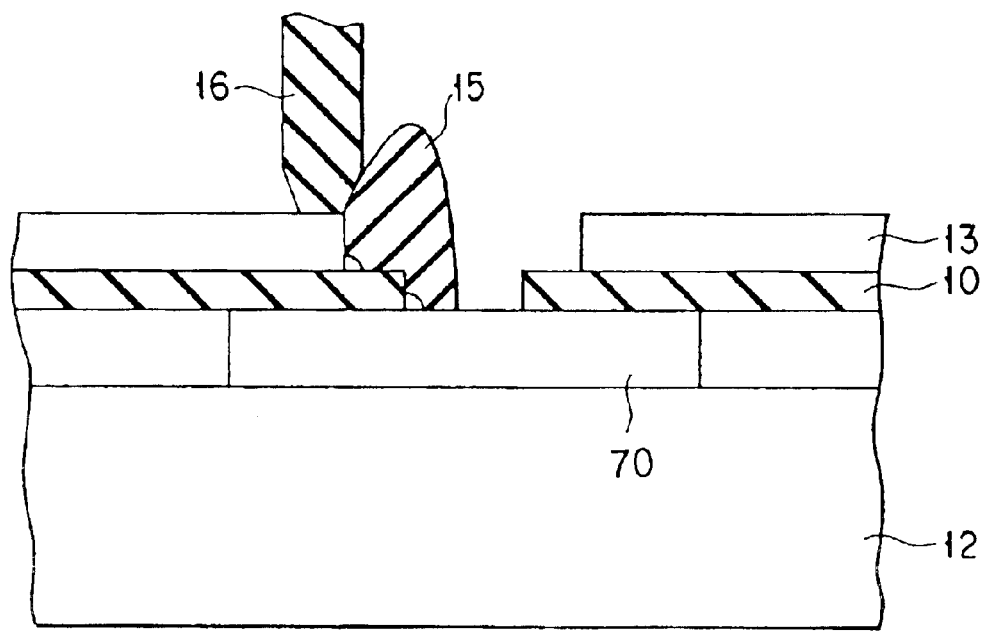
Figure 3C:
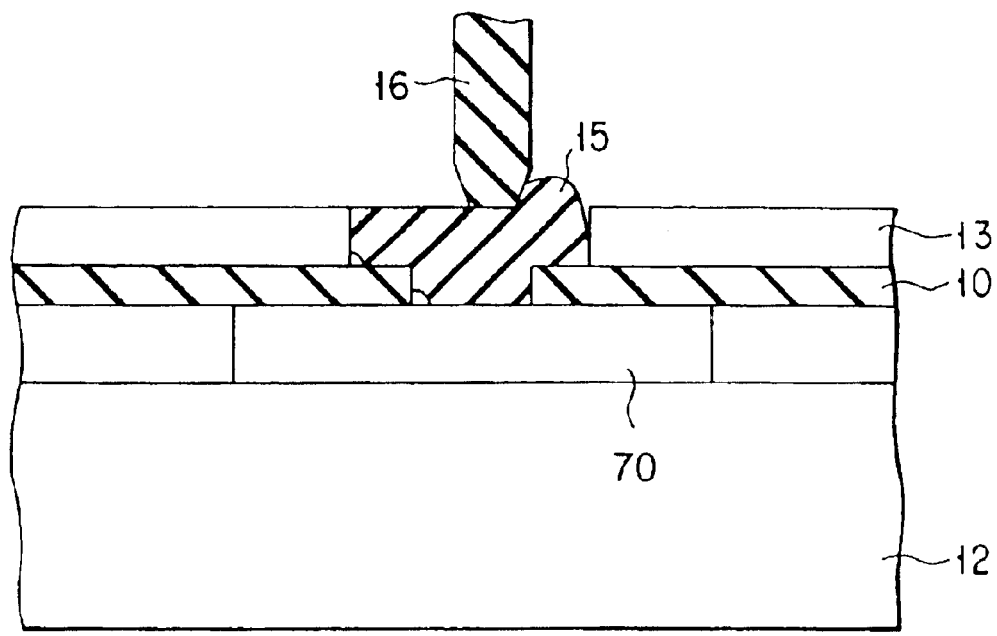
Figure 3D:
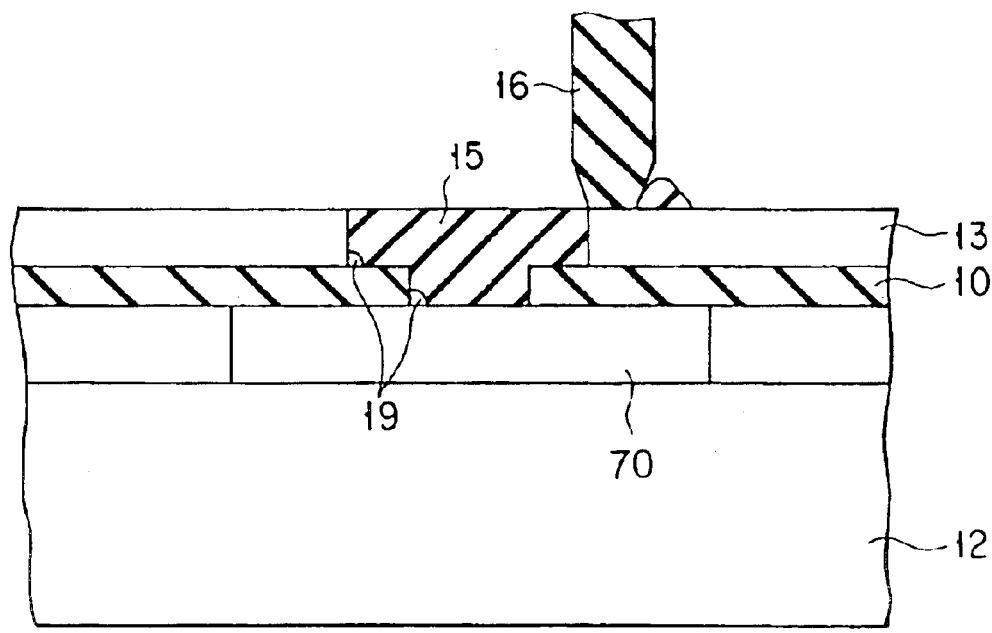
Figure 4:
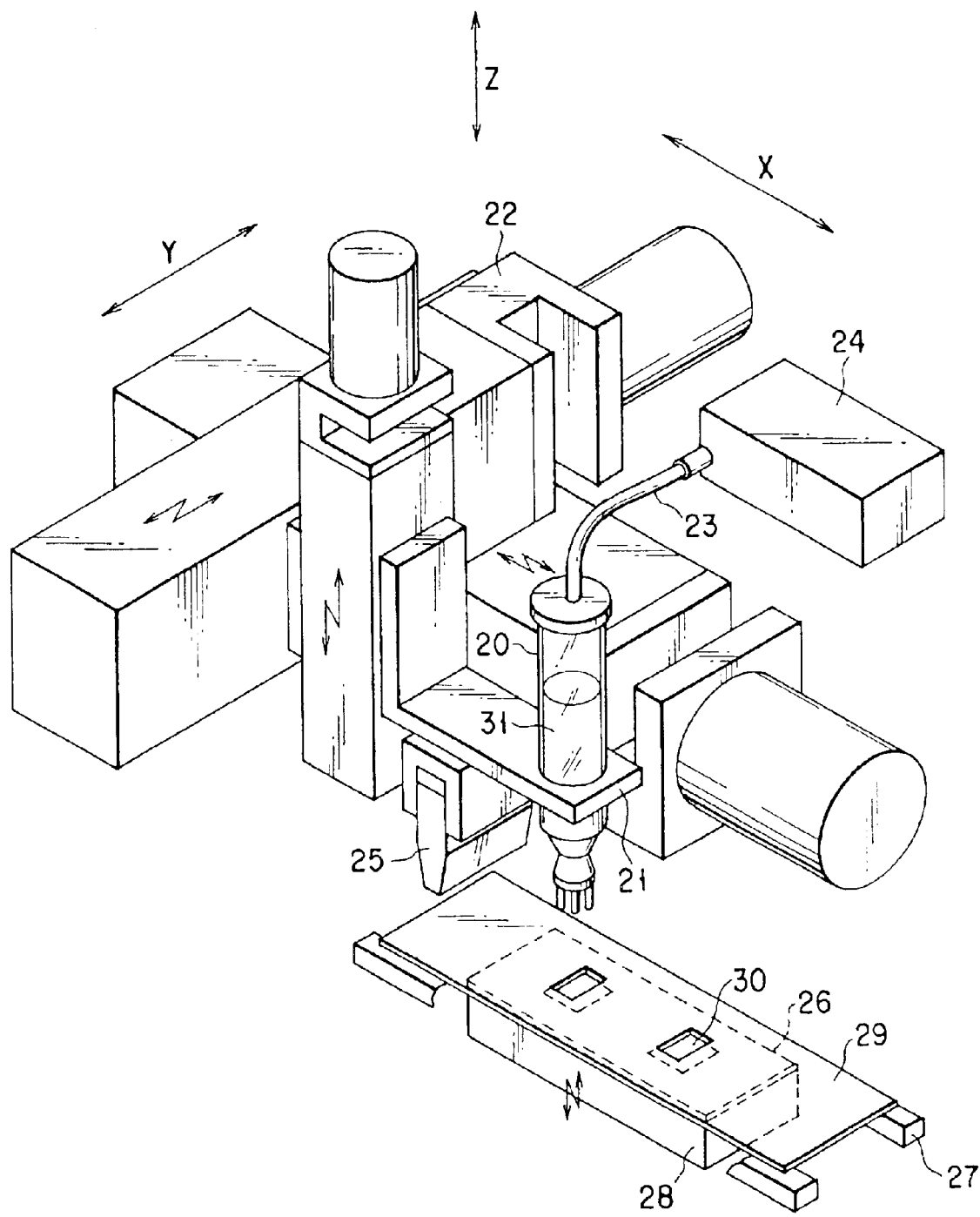
FIG. 4 is a perspective view showing a resin encapsulating apparatus of the present invention.

FIG. 4 is a perspective view showing a resin encapsulating apparatus of the present invention. The resin encapsulating apparatus is used in a resin sealing step in a manufacture of a semiconductor device. As shown in FIG. 4, the resin encapsulating apparatus includes a cylinder 20, cylinder holder 21, XYZ drive section 22, air tube 23, given quantity extruding device 24, squeegee 25, conveying section 27, positioning fixing block 28 and mask 29.

The cylinder 20 contains a viscous resin 31 and mounted on the cylinder holder 21. The cylinder holder 21 is set on the XYZ drive section 22 movable in X, Y, Z (horizontal and vertical) directions. The given amount extruding device 24 is connected to a top section of the cylinder 20 through the air tube 23. The resin within the cylinder 20 is extruded from a forward end of the cylinder 20 by the air pressure control of the given quantity extruding device 24. The squeegee 25 is made of aluminum, rubber, stainless, etc., and mounted on the cylinder holder 21 and arranged above the mask 29. The conveying section 27 is used to convey the semiconductor device to a predetermined position and fixes it in place. The mask 29 has an opening 30.

The operation of the resin encapsulating apparatus will be explained below.

The positional relation of the cylinder 20 and squeegee 25 is height-adjusted such that, taking the flexibility of the squeegee 25 into consideration, the forward end of the cylinder 20 is set to be higher than the lower surface of the squeegee 25. A tape carrier 26 sets a chip to a predetermined position by a previous step not described here. The tape carrier 26 with the chip set there is conveyed by the conveying section 27 to a predetermined position and, after being positioned by the positioning fixing block 28, is fixed in place. Thereafter, the tape carrier 26 is moved by a block drive section (not shown) to a predetermined position and, by being moved up, pushed against the mask set on the conveying section 27. The mask 29 has the opening 30 in a way to correspond to the coating position of the resin 31.

After the tape carrier 26 is positioned and pushed against the mask 29, the cylinder 20 is moved by the XYZ drive section 22 to an edge end position of the mask opening 30. The cylinder 20, while being moved along the opening 30, coats a given amount of resin onto the opening 30 by the given amount extruding device 24. At this time, a resin 31 equal to, or somewhat greater than, a capacity of the opening 30 is coated. Thereafter, the squeegee 25 is moved across the opening 30 to allow the resin 31 to be completely filled in the opening 31 and any excessive resin to be removed. The above-mentioned operation is repeatedly done in a way to correspond to the number of chips set on the tape carrier 26.

Now the resin encapsulating method used on the first embodiment will be explained below with reference to FIGS. 5A to 5D. FIGS. 5A to 5D are cross-sectional views showing a resin coating section of a semiconductor device in which the resin encapsulating method is used. In this resin encapsulating method use is made of the resin encapsulating apparatus shown in FIG. 4. The interval between the forward end of the cylinder 20 and the squeegee 25 is set to be wider than the opening 30 in the coating direction. Here a brief explanation will be given about a semiconductor device on which resin sealing is performed. A chip 43, such as a silicon semiconductor, is set (mounted) on a tape constituting the tape carrier 26. The tape carrier 26 comprises a tape and a plurality of leads (not shown) patterned thereon. The leads and electrode pads (not shown) on the chip surface are electrically connected by bonding wires (not shown).

Figure 5A:
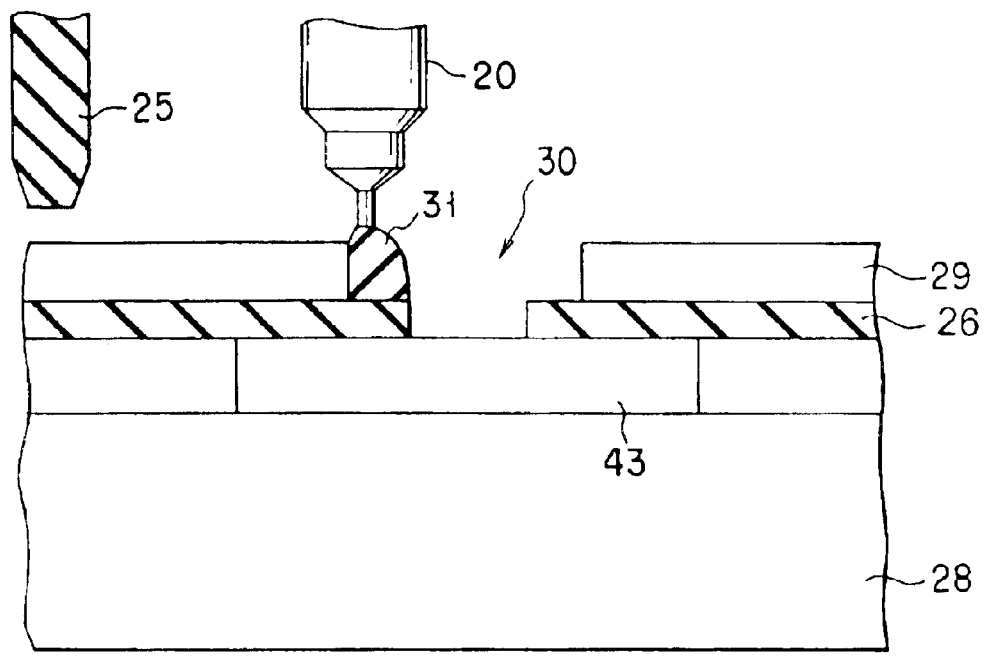
FIGS. 5A to 5D are cross-sectional views of a resin coating section in a semiconductor device in which a resin encapsulating method is used in a first embodiment.

As shown in FIG. 5A, the tape carrier 26 with the chip 43 mounted thereon is set on the positioning fixing block 28. The mask 29 having the opening 30 is set on the tape carrier 26. At this time, the position of the mask 29 is set in a way to allow the opening 30 of the mask 29 to correspond to a resin coating area on the chip 43.

Figure 5B:
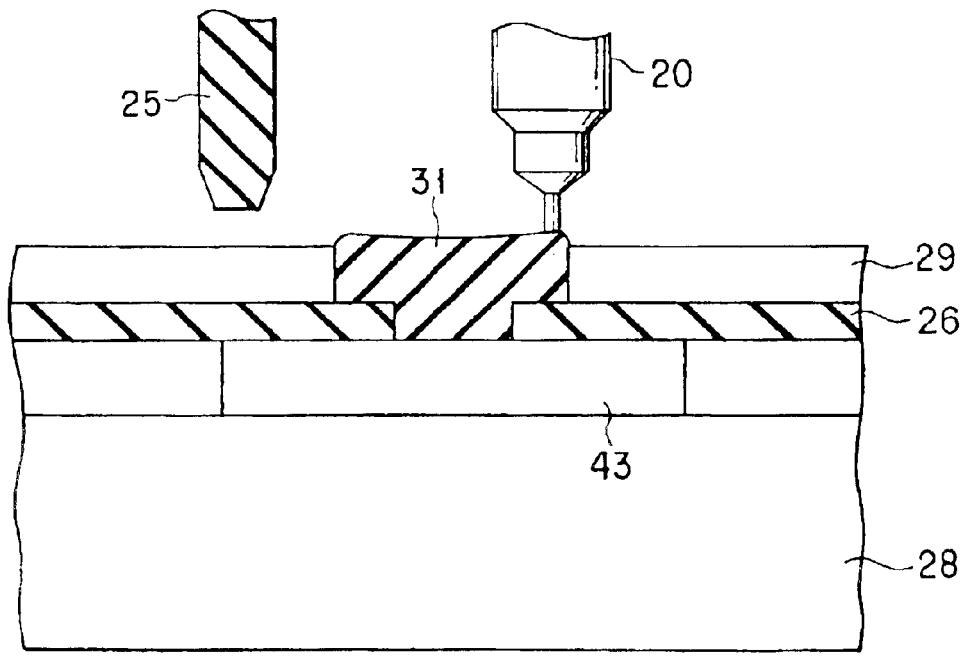
Figure 5C:
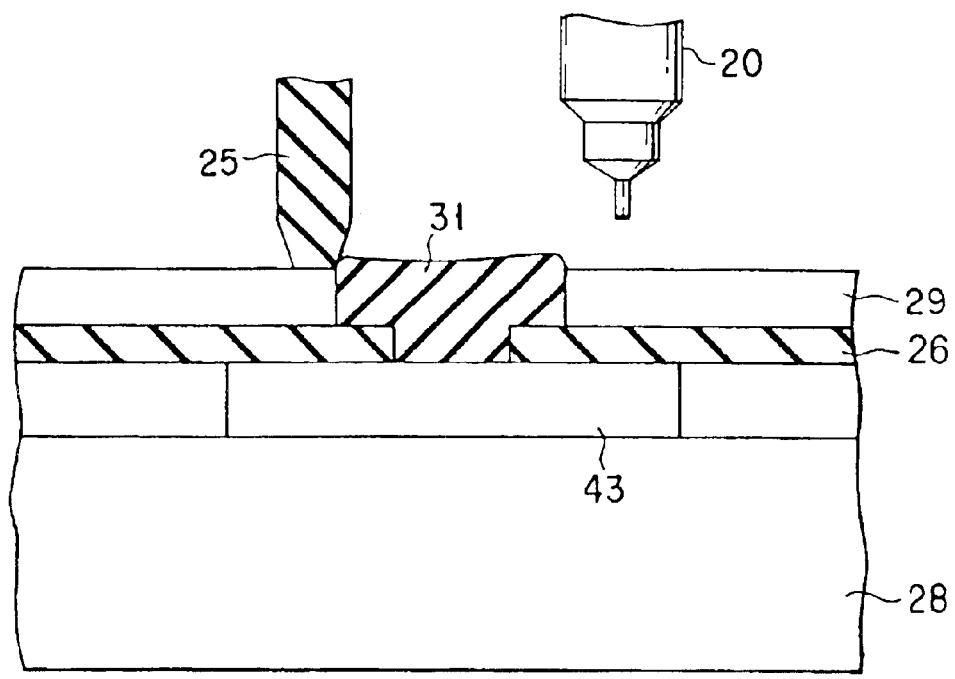
Figure 5D:
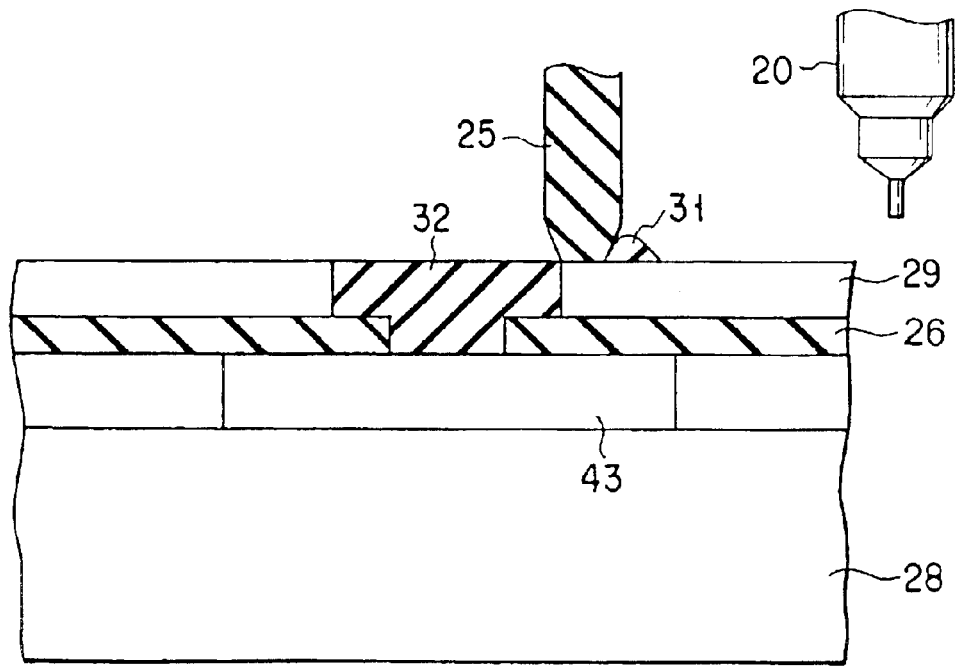

As shown in FIG. 5A, the cylinder 20 is moved to one edge end of the opening 30 and a liquid-like resin 31 is extruded from an extruding hole at the forward end of the cylinder 20. Then, the cylinder 20 is moved from one edge end to the opposite edge end of the opening 30 as shown in FIG. 5B while extruding the resin 31 from its extruding hole. In this way, a somewhat greater amount of resin than the capacity of the opening 30 is coated into the opening 30. As shown in FIGS. 5C and 5D, after the resin 31 has been coated by the cylinder 20 into the opening, the squeegee 25 is moved from the one edge end to the opposite edge end of the opening 30 in the mask 29. By doing so, the resin 31 is buried into the opening 30 and, by removing any excess resin, it forms a resin sealing body 32.

After the sealing of the resin, the tape carrier 26 is removed from the resin encapsulating apparatus and the semiconductor device protected with the resin sealing body 32 is removed from the tape carrier 32.

According to the resin encapsulating method used on the above-mentioned first embodiment, the liquid-like resin 31 is extruded directly into the opening 30 of the mask 29 from the extruding hole of the cylinder and the resin 31 reveals a high viscosity and the resin 31 is filled into the opening 30 without leaving any unfilled portion at the corners of the bottom of the opening 30. Further, after the liquid-like resin 31 has been coated into the opening 30 of the mask 29, the squeegee 25 is moved on the plane of the opening 30 along the surface of the mask 29 to remove any excessive resin 31 and, by doing so, it is possible to form a resin sealing body 32 with high positional accuracy in the X, Y, and Z (height) directions. The position and shape of the resin sealing body 32 can be freely set and the thickness of the resin sealing body 32 can be freely set by the thickness of the mask 29.

According to the resin encapsulating method used on the first embodiment, even in the case where the resin 31 has a relatively high viscosity, as at the printing system, when the liquid-like resin 31 is buried into the opening 30, the resin can be fully filled into the corner edges of the bottom of the opening 30. Further, it is possible to improve a positional accuracy in any direction of the resin sealing body 32 formed at the tape carrier 26 and to use the resin 31 effectively.

The resin encapsulating method used on a second embodiment will be explained below with reference to FIGS. 6A to 6D. FIGS. 6A to 6D are cross-sectional views of a resin coating section of a semiconductor device in which the resin encapsulating method is used. In this resin encapsulting method, use is made of the resin encapsulating apparatus shown in FIG. 4. In this embodiment, the extruding hole of the cylinder 20 and squeegee 25 are arranged near to each other and the interval between the extruding hole of the cylinder 20 and the squeegee 25 is set to be shorter than a length of the opening 30 in coating direction. The resin-sealed semiconductor is the same as that of the first embodiment.

Figure 6A:
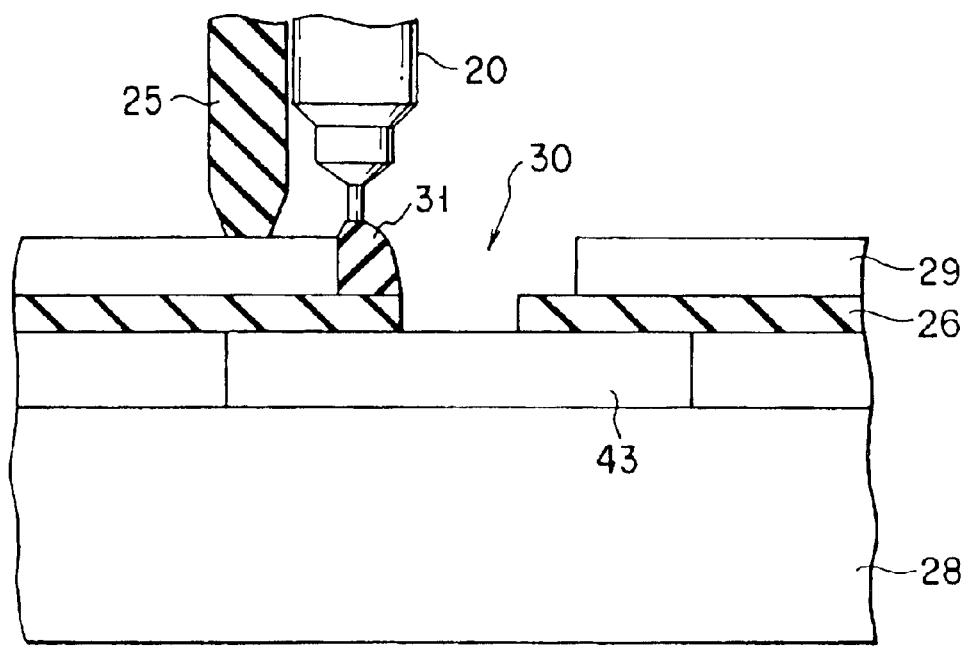
FIGS. 6A to 6D are cross-sectional views of a resin coating section of a semiconductor device in which a resin encapsulating method is used in a second embodiment.

As shown in FIG. 6A, the tape carrier 26 with a chip 43 mounted (set) thereon is set on a positioning fixing block 28. A mask 29 having an opening 30 is set on the tape carrier 26. At this time, a position of the mask 29 is set to allow the opening 30 of the mask 29 to correspond to a resin coating area on the chip 43.

Figure 6B:
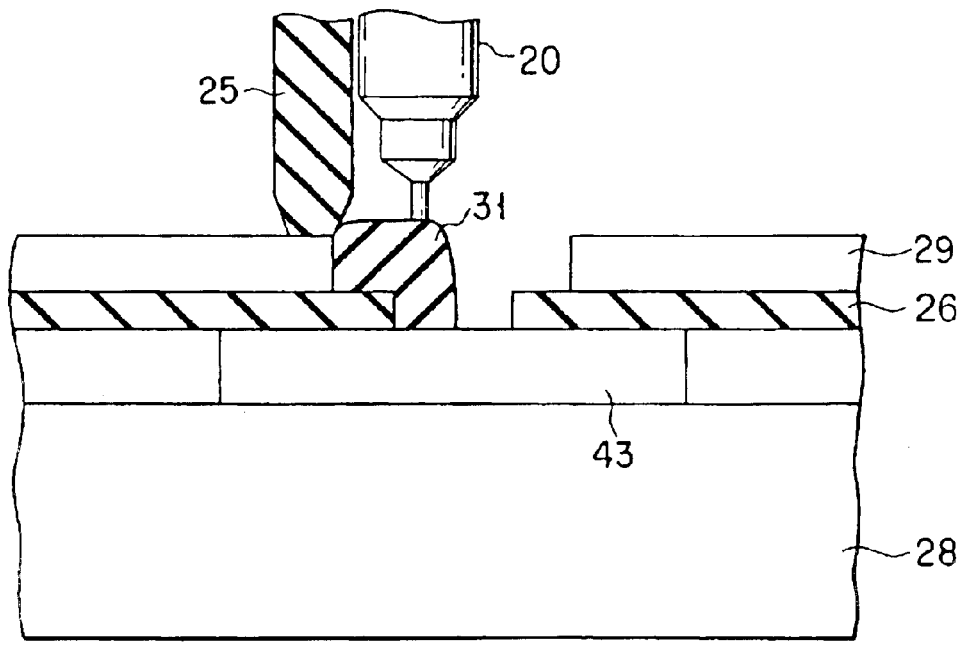
Figure 6C:
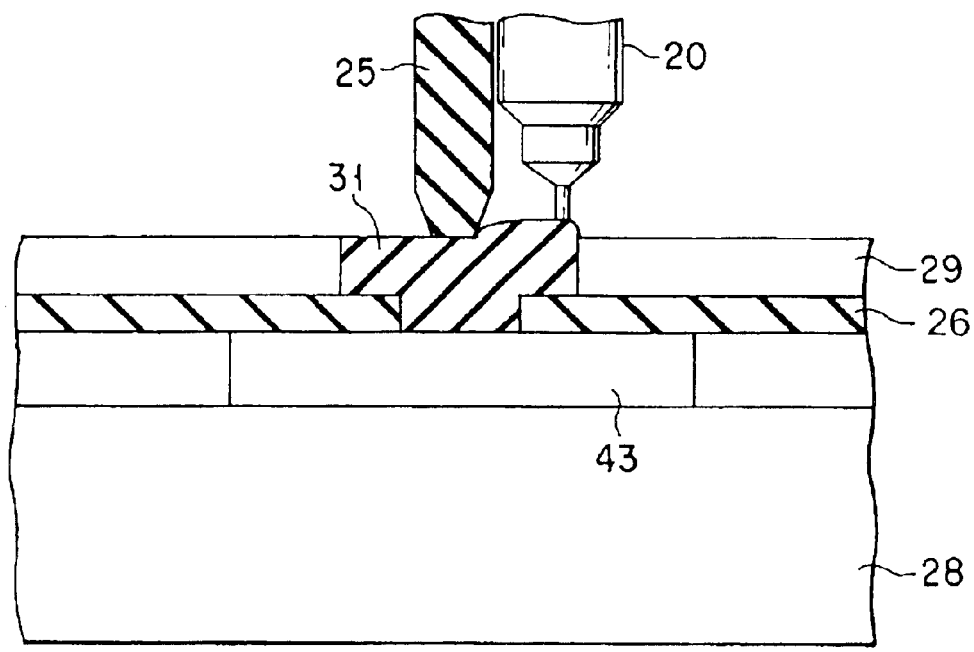
Figure 6D:
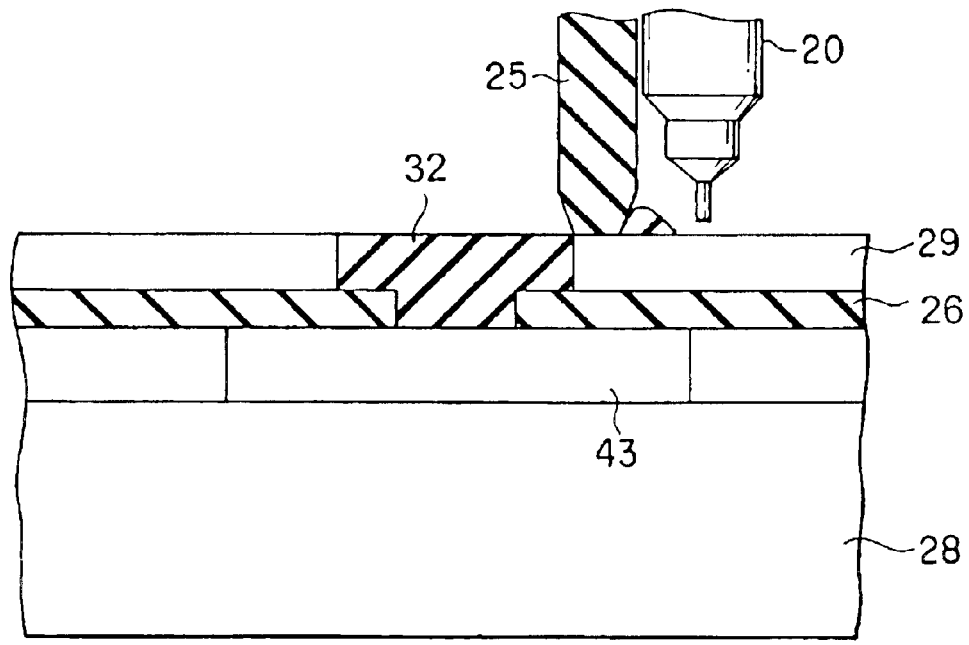

Then, as shown in FIG. 6A, the cylinder 20 is moved to one edge portion of the opening 30 and a liquid-like resin 31 is extruded from an extruding hole of the forward end of the cylinder 20. Then the cylinder 20 is moved from one edge end to an opposite edge end as shown in FIGS. 6B and 6C while extruding resin 31 from its extruding hole. A somewhat greater amount of resin 31 than the capacity of the opening 30 is coated in the opening 30 from the extruding end of the cylinder. At this time, the squeegee 25 is located near to the cylinder 20 and, just after the resin 31 has been extruded from the extruding section, the squeegee 25 is moved from behind the cylinder, that is, moved from one edge end similarly to the opposite edge end along the surface of the mask 29. By doing so, the resin raised from the surface of the mask 29 is fluidized by moving the squeegee 25. Further, any excessive resin 31 raised from the mask surface is removed by the squeegee 25. In this way, just after the resin 31 is partially extruded into the opening 30, the resin is moved by the squeegee 25 and, through such resin fluidization, the resin 31 is readily filled even into a hard-fill portion of the opening.

By doing so, the resin 31 is buried into the opening 30 and, through the removal of any excessive resin, the resin sealing body 32 is formed.

After the resin sealing has been effected, the tape carrier 26 is removed from the resin encapsulation apparatus and a semiconductor device protected by the resin sealing body 32 is taken out of the tape carrier.

According to the resin encapsulating method used on the second embodiment, the liquid-like resin 31 is extruded directly into the opening 30 of the mask 29 from the extruding hole of the cylinder 20 and, therefore, the viscosity of the resin 31 never becomes higher and the resin 31 can be filled into the opening 30 without leaving any unfilled portioned at the corners of the bottom of the opening 30. Further, just after the liquid-like resin 31 has been coated into the opening of the mask 29, any partially raised resin over the plane of the opening 30 of the mask 29 is moved by the squeegee 25 and, without leaving any unfilled portion, the resin can be readily filled into the opening 30 resin fluidization. Further, while the liquid-like resin 31 is being coated into the opening 30 of the mask 29, the squeegee 25 is moved over the plane of the opening 30 along the surface of the mask 29 and removes any excessive resin 31 and it is possible to form a resin sealing body 32 with high positional accuracy in X, Y, and Z (height) directions. The position and shape of the resin sealing body 32 can be freely set by the shape of the mask 29 and the thickness of the resin sealing body 32 can be freely set by the thickness of the mask 29.

According to the resin encapsulating method used on the second embodiment, even in the case where, as in the case of the first embodiment, the liquid-like resin 31 has a relatively high viscosity, as at a printing system, when the resin is buried into the opening 30, the resin can be fully filled into the corners of the bottom of the opening 30. Further, it is possible to improve the positional accuracy in any direction of the resin sealing body 32 formed at the tape carrier 26.

Figure 7A:
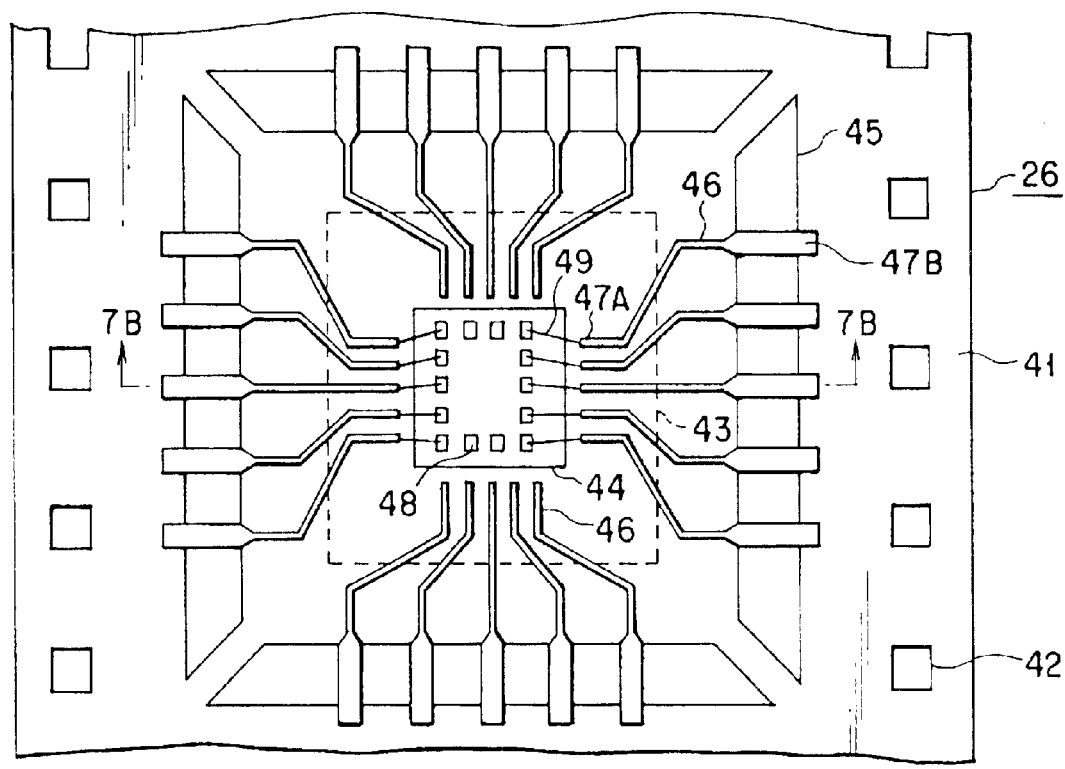
FIG. 7A is a plan view showing a tape carrier using a TAB system.
Figure 7B:
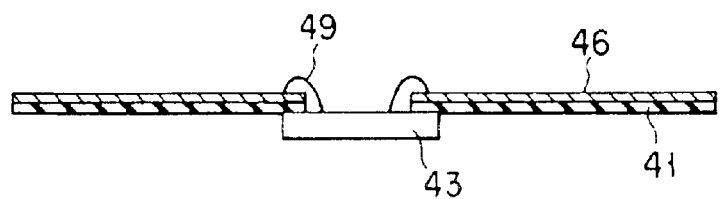
FIG. 7B is a cross-sectional view substantially as taken along line 7B—7B in FIG. 7A.

The semiconductor device manufactured with the use of the above-mentioned embodiment will be explained below with reference to FIGS. 7A, 7B and 8A, 8B. FIG. 7A is a plan view showing a tape carrier using a TAB (tape automated bonding) system and FIG. 7B is a cross-sectional view as taken along line 7B—7B in FIG. 7A.

A resin film 41 constituting a base material of the tape carrier 26 is formed of a plastics insulating material, such as a flexible polyimide resin and polyester. The resin film 41 has a band-like configuration. Feed holes 42 are provided at predetermined intervals at both side edges of the band-like film and used for moving the film in a longitudinal direction.

A chip mount opening 44 is formed at central area in a width direction of the resin film 41 to mount a chip 43 there. Elongated trapezoidal openings 45 are provided at predetermined intervals around the chip mount opening 44 to correspond to respective sides of the opening 44. Leads 46 are formed between the central opening 44 and its circumferential openings 45.

The leads 46 are usually formed by patterning, by means of etching, a metal foil, such as Cu, attached to a whole surface of a film. The thus formed leads 46 have an interconnect line width and interval adequately smaller than those of ceramics package and can be formed with high accuracy. The lead 46 comprises an inner lead section 47A connected to the chip 43 and outer lead section 47B supported over the circumferential opening 45. The forward end of the inner lead section 47A of the lead 46 is connected by a bonding wire 49 to a connection electrode 48 on the chip 43. Those connection electrodes 48 are comprised of a plurality of pads arranged on the chip 43 or bumps, etc., formed on the pads. Further, the connection electrodes 48 are regularly arranged along respective sides of a major surface of the chip 43. For this reason, groups of leads 46 connected to the connection electrodes 48 are so arranged as to have the same pattern. In FIG. 7A, an example is shown in which the leads 46 are derived out from the chip 43 in four directions. There is some type in which leads are derived from opposite two directions.

The tape carrier 26 connecting together the lead 46 and connection electrode 48 by the bonding wire 49 is set on the positioning fixing block 28 of the resin encapsulating apparatus shown in FIG. 4. And by the resin encapsulating apparatus the resin sealing body is formed on the tape carrier 26 including the chip 43.

Figure 8A:
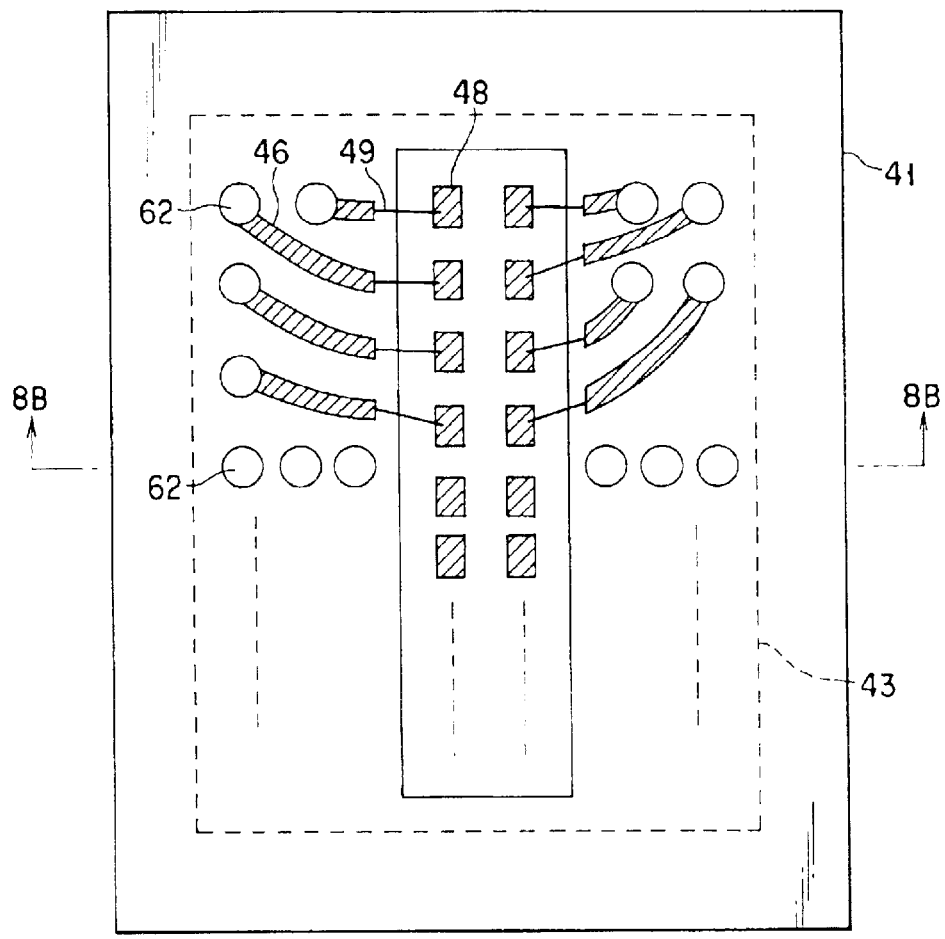
FIG. 8A is a plan view of a semiconductor device mounted on a tape carrier of FIG. 7A on which a resin sealing body is formed.
Figure 8B:
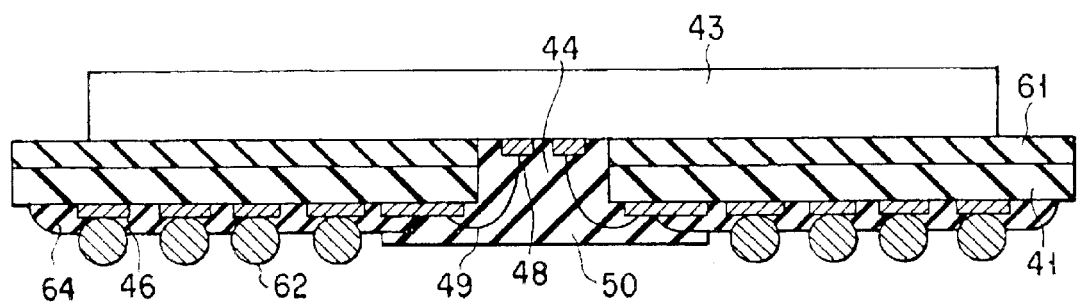
FIG. 8B is a cross-sectional view substantially as taken along line 8B—8B in FIG. 8A.

FIGS. 8A and 8B show a semiconductor device of such a type that leads are derived out in two directions. FIG. 8A is a plan view showing a semiconductor device mounted on the tape carrier and having a resin sealing body applied thereto by the resin encapsulating apparatus shown in FIG. 4, and shows a state in which the resin sealing body is shown in a see-through manner. FIG. 8B is a cross-sectional view substantially as taken along line 8B—8B in FIG. 8B.

In FIGS. 8A and 8B, a chip 43 is joined by a bonding agent layer 61 to an area including a chip mount opening 44 of a resin film 41. Connection electrodes (electrode pads) 48 on the chip 43 are arranged in the chip mounting opening 44. The leads 46 patterned on the resin film 41 and electrode pads 48 on the chip 43 are connected together by bonding wires 49.

The resin sealing body 50 covers a central area of the chip 43 with the chip-to-lead connection portion as a center. A soldering ball 62 is mounted at any given places on the leads 46 on the resin film 41 and comprised of an external connection terminal. The surface of the lead 48 is covered with a solder resist 64 except the soldering ball 62.

The height of the resin sealing body 50 is so formed as to be lower than that of the soldering ball 62. This is because a connection to an outside is made by the soldering ball 62 formed flush with the resin sealing body 50. In a practical dimension, the height from the surface of the lead 46 to the top surface of the resin sealing body 50 is controlled in a range of 0.175 mm±0.025 mm by the resin encapsulating apparatus and method shown in FIG. 4. Further, the height from the surface of the lead 46 to the top surface of the soldering ball 62 is set to be about 0.5 mm.

Figure 9:
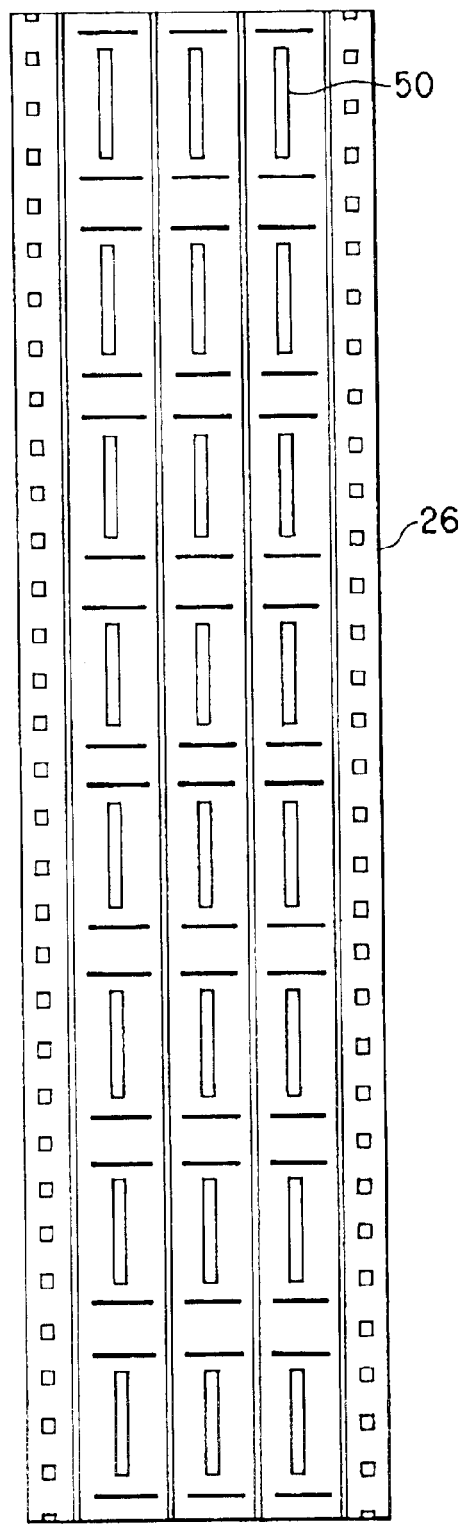
FIG. 9 shows a practical form of a 3-rows×8-arrays type tape carrier used in the resin encapsulating apparatus shown in FIG. 4.

With reference to FIG. 9, an explanation will be made below about a tape carrier used in a resin encapsulating apparatus shown in FIG. 4. FIG. 9 is a plan view showing a practical form of a 3-rows×8-arrays tape carrier 26 used in the resin encapsulating apparatus shown in FIG. 4. The tape carrier is sequentially covered beneath the cylinder 20 and a liquid-like resin 31 is coated on the tape carrier to provide a resin sealing body 50.

In this embodiment, the resin sealing body is formed, as designed, by the above-mentioned apparatus and method and it is possible to provide a resin sealing body of high dimensional accuracy. By, in this way, coating the liquid plastics resin, such as an epoxy resin and silicone, onto the chip mounted on the tape carrier, the chip is protected from any mechanical stress and various environmental conditions and can ensure the reliability of the semiconductor device.

Figure 10A:
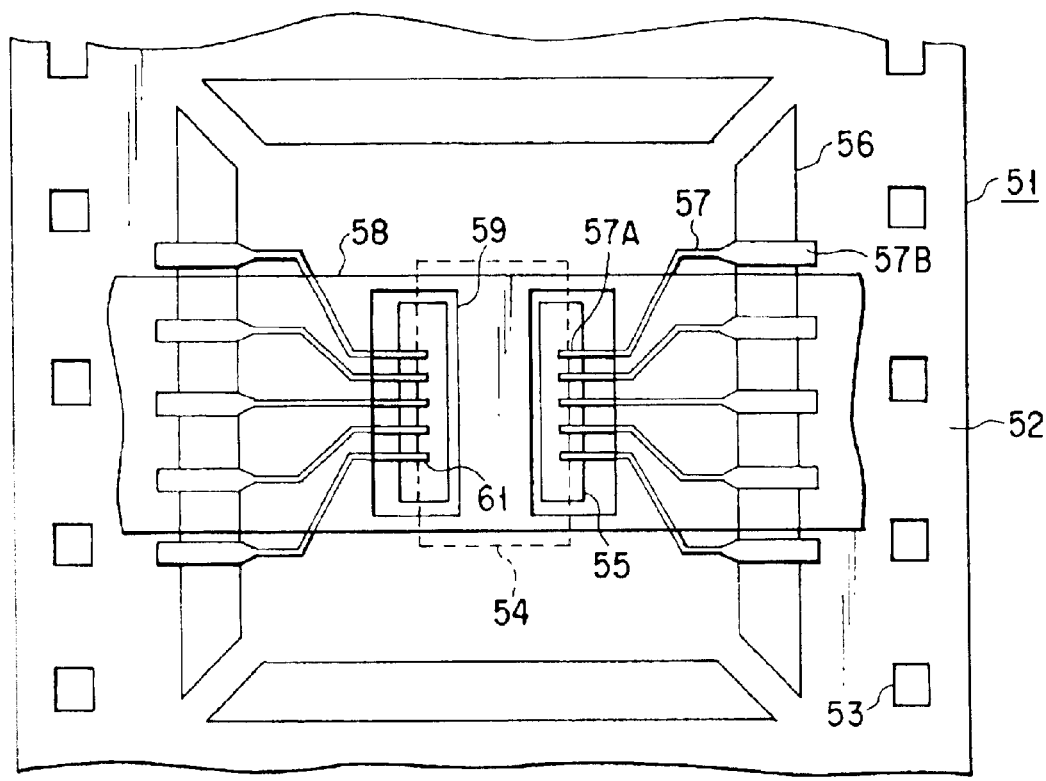
FIG. 10A is a plan view showing another type carrier used in a TAB system.
Figure 10B:
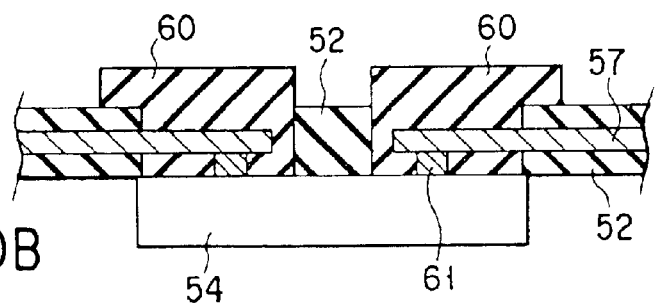
FIG. 10B is a cross-sectional view showing a semiconductor device mounted on the tape carrier shown in FIG. 10A and having a resin sealing body formed thereon.
Figure 10C:
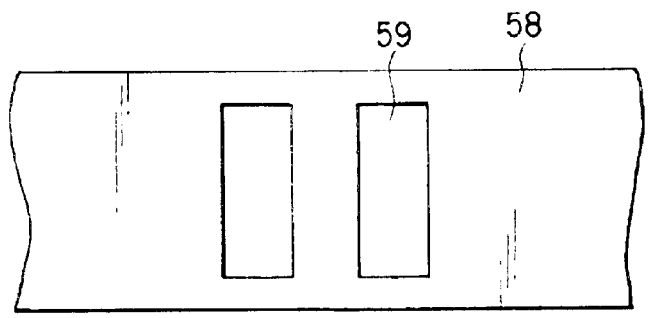
FIG. 10C is a plan view of a mask used for forming the semiconductor device shown in FIG. 10B.

With reference to FIGS. 10A, 10B and 10C, an explanation will be given below about another semiconductor device manufactured by the above-mentioned embodiment.

FIG. 10A is a plan view of a tape carrier using a TAB system. FIG. 10B is a cross-sectional view showing a semiconductor device formed with the use of the tape carrier. FIG. 10C is a plan view showing a mask of a resin encapsulating apparatus used for forming such a semiconductor device.

The chip shown in FIGS. 10A, 10B has a structure such that leads are derived out in two opposite directions. As in the case of the tape carrier as shown in FIG. 7A, a resin film 52 serving as a base material of the tape carrier 51 is made of a plastics insulating material. The resin film 52 has a band-like configuration. Feed holes 53 are formed at predetermined intervals in a longitudinal direction at both side edges of the band-like resin film A chip mounting opening 55 is formed at the middle of a width direction of the film. Elongated trapezoidal openings 56 are formed at predetermined intervals around the chip mounting opening 55 in a manner to have each side of the opening 55 correspond to a corresponding opposite side of the opening 55.

Leads are formed at those areas between the central opening 55 and the openings 56 around the central opening 55. Leads 57 each comprise an inner lead section 57A connected to a chip 54 and outer lead section 57B supported over the circumferential opening 56. The forward end of the inner lead section 57A of the lead 57 is connected by a bump 61 to a corresponding connection electrode 61 formed on the chip 54. In FIG. 10A, a mask 58 is shown which is set on the tape carrier 51.

A tape carrier 51 with the chip 54 mounted thereon is set on the positioning fixing block 28 of the resin encapsulating apparatus shown in FIG. 4. And the mask 58 as shown in FIG. 10C is set on the tape carrier 51. At this time, the opening 59 of the mask 58 sets the position of the mask 58 so as to correspond to a resin coating area on the chip 54. And a liquid-like resin 31 is extruded into the opening 59 by the resin encapsulating apparatus and any excessive resin is removed with the use of the squeegee 25. By doing so, as shown in FIG. 10B, a resin sealing body 60 is formed on the chip in a manner to cover a connection area between the chip 54 and the forward end of the lead 57.

Figure 11A:
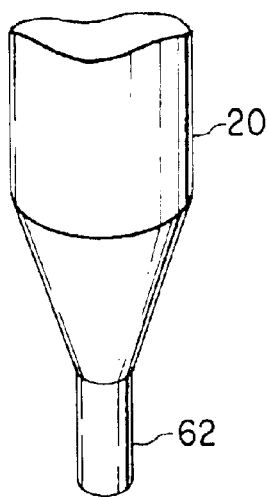
FIG. 11A is a view of a cylinder of the resin encapsulating apparatus shown in FIG. 4.
Figure 11B:
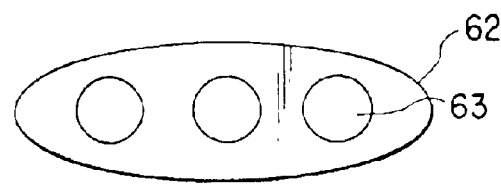
FIGS. 11B and 11C, each, are a plan view showing extruding nozzles of the cylinder of the resin encapsulating apparatus shown in FIG. 4.
Figure 11C:
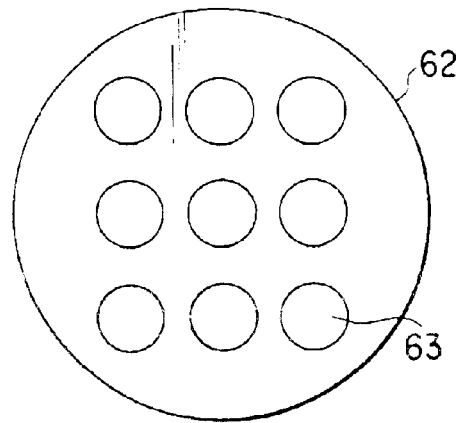

The cylinder of the resin encapsulating apparatus as shown in FIG. 4 will be explained below with reference to FIGS. 11A, 11B and 11C. FIG. 11A is a view showing the cylinder mounted on the resin encapsulating apparatus shown in FIG. 4. FIGS. 11B and 11C, each, are a plan view showing extruding holes (nozzle section) of the cylinder of the resin encapsulating apparatus shown in FIG. 4. FIGS. 11B and 11C are enlarged views showing the nozzle section of the cylinder.

The cylinder 20 extrudes a liquid-like resin from the nozzle section provided on the forward end 62. A plurality of nozzles are usually provided at the forward end 62 of the cylinder 20. As shown in FIG. 11B, three linear nozzles 63 may, in some case, be provided at the forward end 62 of the cylinder 20 or, as shown in FIG. 11C, a plurality of nozzles 63 may be arranged, in some case, in a matrix array on the forward end 62 of the cylinder 20. Though not shown in Figures, a single nozzle is, in some case, provided at the forward end of the cylinder 20. The cylinder 20 serves the purpose of uniformly coating the liquid-like resin while being moved from one edge end to the opposite edge end of the opening of the mask and it is possible to achieve uniform resin coating by using more number of nozzles.

In the resin encapsulating apparatus and method of the present invention, the wettability of the fluidizing resin can be positively secured and it is possible to achieve less use of the resin. The present invention is directed to a method for manufacturing a semiconductor device using the resin encapsulating apparatus and method.

In the resin encapsulating apparatus shown in FIG. 4, the fluidizing resin supplying cylinder 20 and squeegee 25 can be separately driven by separate drive mechanisms. That is, such drive device may include a first drive section for driving the cylinder 20 and second drive section for driving the squeegee 25, that is, two drive sections. By doing so, it is possible to obtain a wide operation of the sealing head.

According to the present invention as set out above, when the resin sealing body is formed on the semiconductor device, it is possible to remarkably improve the XY- and Z-direction dimensional accuracy of the resin sealing body and to prominently decrease the occurrence of defective products resulting from an insufficient supply of the resin. Since it is possible to obviate the need to supply a more than necessary amount of resin, the resin can be used very effectively.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resin encapsulating apparatus for forming a resin sealing body on a semiconductor chip mounted on a carrier comprising:

a retaining section which retains the carrier on which the semiconductor chip is mounted;

a mask set on the carrier and having an opening at which a part of the semiconductor chip is exposed;

an extruding section configured to extrude a fluidizing resin in an extruding direction into the opening of the mask;

a first drive section which drives the extruding section;

a squeegee which causes a movement of the fluidizing resin present over the opening which is extruded from the extruding section into the opening, an interval between the extruding section and the squeegee being set to be wider than a length of the opening in the extruding direction; and a second drive section which drives the squeegee independently of the first drive section which drives the extruding section.

2. A resin encapsulating apparatus according to claim 1, wherein the first drive section drives the extruding section to be moved over the opening and, during the movement of the extruding section, the extruding section dropwise supplies the fluidizing resin into the opening.

3. A resin encapsulating apparatus according to claim 1, wherein the first drive section drives the extruding section from one edge end to an opposite edge end of the opening and, during the movement of the extruding section, the extruding section dropwise supplies the fluidizing resin into the opening.

4. A resin encapsulating apparatus according to claim 3, wherein, when the first drive section moves the extruding section from one edge end to an opposite edge end of the opening, the second drive section drives the squeegee to be moved from behind the extruding section and from one edge end to the opposite edge end of the opening and, during the movement of the squeegee, the squeegee moves the fluidizing resin which is supplied dropwise from the extruding section.

5. A resin encapsulating apparatus for forming a protective resin sealing body on a semiconductor chip mounted on a carrier in which the resin sealing body and external connection balls are formed on the same surface side of the semiconductor chip, the resin encapsulating apparatus comprising:

a retaining section which retains the carrier on which the semiconductor chip is mounted;

a mask set on the carrier and having an opening at which, when the mask is set on the carrier, an area of the semiconductor chip at which the resin sealing body is to be formed is exposed;

an extruding section configured to extrude a fluidizing resin in an extruding direction into the opening of the mask;

a first drive section which drives the extruding section;

a squeegee which causes a movement of the fluidizing resin present over the opening which is extruded from the extruding section into the opening, an interval between the extruding section and the squeegee being set to be wider than a length of the opening in the extruding direction; and a second drive section which drives the squeegee independently of the first drive section which drives the extruding section.

6. A resin encapsulating apparatus according to claim 5, wherein the first drive section drives the extruding section to be moved over the opening and, during the movement of the extruding section, the extruding section dropwise supplies the fluidizing resin into the opening.

7. A resin encapsulating apparatus according to claim 5, wherein the first drive section drives the extruding section and moves the extruding section from one edge end to an opposite edge end of the opening and, during the movement of the extruding section, the extruding section dropwise supplies the fluidizing resin into the opening.

8. A resin encapsulating apparatus according to claim 6, wherein, when the first drive section moves the extruding section from one edge end to the opposite edge end of the opening, the second drive section drives the squeegee to be moved from behind the extruding section and from one edge end to the opposite edge end of the opening and, during the movement of the squeegee, the squeegee moves the fluidizing resin which is supplied dropwise from the extruding section.

9. A resin encapsulating apparatus according to claim 1, wherein the squeegee moves separately from the extruding section.

10. A resin encapsulating apparatus according to claim 1, wherein the second drive section causes the squeegee to come into contact with one side of the opening of the mask, to move to another side of the opening which is opposed to the one side of the opening, and then to move away from the mask.

11. A resin encapsulating apparatus according to claim 5, wherein the squeegee moves separately from the extruding section.

12. A resin encapsulating apparatus according to claim 5, wherein the second drive section causes the squeegee to come into contact with one side of the opening of the mask, to move another side of the opening which is opposed to the one side of the opening, and to move away from the mask.

13. A resin encapsulating apparatus for forming a resin sealing body on a semiconductor chip mounted on a carrier comprising:

a retaining section which retains the carrier on which the semiconductor chip is mounted;

a mask set on the carrier and having an opening at which a part of the semiconductor chip is exposed;

an extruding section configured to extrude a fluidizing resin in an extruding direction into the opening of the mask;

a first drive section which drives the extruding section;

a squeegee which causes a movement of the fluidizing resin present over the opening which is extruded from the extruding section into the opening, an interval between the extruding section and the squeegee being set to be shorter than a length of the opening in the extruding direction; and a second drive section which drives the squeegee independently of the first drive section which drives the extruding section.

14. A resin encapsulating apparatus for forming a protective resin sealing body on a semiconductor chip mounted on a carrier in which the resin sealing body and external connection balls are formed on the same surface side of the semiconductor chip, the resin encapsulating apparatus comprising:

a retaining section which retains the carrier on which the semiconductor chip is mounted;

a mask set on the carrier and having an opening at which, when the mask is set on the carrier, an area of the semiconductor chip at which the resin sealing body is to be formed is exposed;

an extruding section configured to extrude a fluidizing resin in an extruding direction into the opening of the mask;

a first drive section which drives the extruding section;

a squeegee which causes a movement of the fluidizing resin present over the opening which is extruded from the extruding section into the opening, an interval between the extruding section and the squeegee being set to be shorter than a length of the opening in the extruding direction; and a second drive section which drives the squeegee independently of the first drive section which drives the extruding section.

* * * * *